US009611987B2

(12) United States Patent
Kelchner et al.

(10) Patent No.: US 9,611,987 B2
(45) Date of Patent: Apr. 4, 2017

(54) WHITE LIGHT SOURCE EMPLOYING A III-NITRIDE BASED LASER DIODE PUMPING A PHOSPHOR

(71) Applicant: The Regents of the University of California, Oakland, CA (US)

(72) Inventors: Kathryn M. Kelchner, Santa Barbara, CA (US); James S. Speck, Goleta, CA (US); Nathan A. Pfaff, Santa Barbara, CA (US); Steven P. DenBaars, Goleta, CA (US)

(73) Assignee: The Regents of the University of California, Oakland, CA (US)

( * ) Notice: Subject to any disclaimer, the term of this patent is extended or adjusted under 35 U.S.C. 154(b) by 15 days.

(21) Appl. No.: 14/066,012

(22) Filed: Oct. 29, 2013

(65) Prior Publication Data

US 2014/0126200 A1 May 8, 2014

Related U.S. Application Data

(60) Provisional application No. 61/723,681, filed on Nov. 7, 2012.

(51) Int. Cl.

| | |
|---|---|
| ***H01L 29/20*** | (2006.01) |
| ***H01L 21/205*** | (2006.01) |
| ***F21K 99/00*** | (2016.01) |
| ***F21K 9/90*** | (2016.01) |
| ***F21K 9/64*** | (2016.01) |

(52) U.S. Cl.
CPC .................. *F21K 9/56* (2013.01); *F21K 9/64* (2016.08); *F21K 9/90* (2013.01)

(58) Field of Classification Search
CPC ................. F21K 9/56; F21K 9/64; F21K 9/90
See application file for complete search history.

(56) References Cited

U.S. PATENT DOCUMENTS

| | | | | |
|---|---|---|---|---|
| 5,365,534 A | 11/1994 | Janssen et al. | | |
| 2004/0263074 A1* | 12/2004 | Baroky ................ | C09K 11/574 313/512 | |

(Continued)

FOREIGN PATENT DOCUMENTS

| | | |
|---|---|---|
| EP | 1051759 | 11/2000 |
| EP | 1911826 | 4/2008 |
| WO | 2014036409 | 10/2014 |

OTHER PUBLICATIONS

Hashimoto et al, High-Power 2.8W Blue-Violet Laser Diode for White Light Sources,Optical Review vol. 19, No. 6, Jul. 2012, 412-414.*

(Continued)

*Primary Examiner* — Tracie Y Green
(74) *Attorney, Agent, or Firm* — Gates & Cooper LLP

(57) ABSTRACT

A white light source employing a III-nitride based laser diode pumping one or more phosphors. The III-nitride laser diode emits light in a first wavelength range that is down-converted to light in a second wavelength range by the phosphors, wherein the light in the first wavelength range is combined with the light in the second wavelength range to create highly directional white light. The light in the first wavelength range comprises ultraviolet, violet, blue and/or green light, while the light in the second wavelength range comprises green, yellow and/or red light.

22 Claims, 8 Drawing Sheets

(56) References Cited

U.S. PATENT DOCUMENTS

| | | | | |
|---|---|---|---|---|
| 2008/0198881 | A1* | 8/2008 | Farrell et al. | 372/9 |
| 2010/0032695 | A1 | 2/2010 | Fellows-Demille et al. | |
| 2010/0096974 | A1 | 4/2010 | Setlur et al. | |
| 2010/0276710 | A1* | 11/2010 | Sampath | B82Y 20/00 257/94 |
| 2011/0222265 | A1* | 9/2011 | Drenten | F21S 48/1154 362/84 |
| 2013/0259079 | A1 | 10/2013 | Bhattacharya et al. | |

OTHER PUBLICATIONS

PCT International Search Report and Written Opinion dated Mar. 20, 2014 for PCT Application No. PCT/US2013/067240.

Narukawa, Y. et al., "White Light Emitting Diodes With Super-High Luminous Efficacy", Journal of Physics D: Applied Physics. 43 354002 (2010).

Crump, P.A. et al., "85% Power Conversion Efficiency 975-nm Broad Area Diode Lasers at—50° C., 76 % at 10° C." in Proceedings of the Conference on Lasers and Electro-Optics (CLEO), Long Beach, 2006. Optical Society of America.

Pimputkar, S. et al., "Prospects for LED Lighting", Nature Photonics, vol. 3, Apr. 2009.

Someya, J., et al., "19.3: Laser TV: Ultra-Wide Gamut for a New Extended Color-Space Standard, xvYCC", SID Symposium Digest of Technical Papers 37 (1): 1134-1137 (2006).

Waltereit, P. et al., "Nitride semiconductors free of electrostatic fields for efficient white light-emitting diodes." 406, 865-868 (2000).

Melo T., et al., "Gain comparison in polar and nonpolar / semipolar gallium-nitride-based laser diodes." Semiconductor Science and Technology 27 (2): 024015 (2012).

Scheibenzuber et al., "Calculation of optical eigenmodes and gain in semipolar and nonpolar InGaN/GaN laser diodes." Physical Review B 80, 1-16 (2009).

Park, S. H. "Crystal Orientation Effects on Many-Body Optical Gain of Wurtzite InGaN/GaN Quantum Well Lasers." Jpn. J. Appl. Phys. 42 (2003) L170.

Okamoto, K. et al., "Continuous-Wave Operation of m-Plane InGaN Multiple Quantum Well Laser Diodes." Jpn. J. Appl. Phys. 46 L187 (2007).

Raring, J. W. et al., "High-Efficiency Blue and True-Green-Emitting Laser Diodes Based on Non-c-Plane Oriented GaN Substrates" Applied Physics Express 3 112101 (2010).

Neumann, A. et al., "Four-color laser white illuminant demonstrating high color-rendering quality," Opt. Express 19, A982-A990 (2011).

Mihokova, E. et al., "Luminescence and scintillation properties of YAG:Ce single crystal and optical ceramics." Journal of Luminescence 126(1): 77-80 (2007).

Boeriu, Horatio, "BMW develops laser light for the car," Sep. 1, 2011, http://www.bmwblog.com/2011/09/01/bmw-develops-laser-light-for-the-car/.

Ryu, H. et al., "High-Brightness Phosphor-Conversion White Light Source Using InGaN Blue Laser Diode," Journal of the Optical Society of Korea 14, 415-419 (2010).

Farrell, R. M. et al., "High-power blue-violet AlGaN-cladding-free m-plane InGaN/GaN laser diodes," Appl. Phys. Lett. 99, 171113 (2011).

Nichia Corporation, "Products: Laser Diode," 2010, Oct. 24, 2012, http://www.nichia.co.jp/en/product/laser.html.

* cited by examiner

WHITE LIGHT SOURCE EMPLOYING A III-NITRIDE BASED LASER DIODE PUMPING A PHOSPHOR

CROSS REFERENCE TO RELATED APPLICATIONS

This application claims the benefit under 35 U.S.C Section 119(e) of the following co-pending and commonly-assigned patent application:

U.S. Provisional Patent Application Ser. No. 61/723,681, filed on Nov. 7, 2012, by Kathryn M. Kelchner, James S. Speck, Nathan A. Pfaff, and Steven P. DenBaars, and entitled "WHITE LIGHT SOURCE EMPLOYING A III-N BASED LASER DIODE PUMPING A PHOSPHOR,";

which application is incorporated by reference herein.

This application is related to the following applications:

U.S. Utility patent application Ser. No. 12/536,253, filed on Aug. 5, 2009, by Natalie Fellows DeMille, Hisashi Masui, Steven P. DenBaars, and Shuji Nakamura, entitled "TUNABLE WHITE LIGHT BASED ON POLARIZATION SENSITIVE LIGHT-EMITTING DIODES,", which application claims priority under 35 U.S.C. §119(e) to co-pending and commonly-assigned U.S. Provisional Application Ser. No. 61/086,428, filed on Aug. 5, 2008, by Natalie N. Fellows, Hisashi Masui, Steven P. DenBaars, and Shuji Nakamura, entitled "TUNABLE WHITE LIGHT BASED ON POLARIZATION SENSITIVE LIGHT-EMITTING DIODES,", and U.S. Provisional Application Ser. No. 61/106,035, filed on Oct. 16, 2008, by Natalie N. Fellows, Hisashi Masui, Steven P. DenBaars, and Shuji Nakamura, entitled "WHITE LIGHT-EMITTING SEMICONDUCTOR DEVICES WITH POLARIZED LIGHT EMISSION,";

P.C.T. International Patent Application Serial No. US2013/05753, filed on Aug. 30, 2013, by Ram Seshadri, Steven P. DenBaars, Kristin A. Denault, and Michael Cantore, and entitled HIGH-POWER, LASER-DRIVEN, WHITE LIGHT SOURCE USING ONE OR MORE PHOSPHORS,", which application claims priority under 35 U.S.C. §119(e) to co-pending and commonly-assigned U.S. Provisional Patent Application Ser. No. 61/695,120, filed on Aug. 30, 2012, by Ram Seshadri, Steven P. DenBaars, Kristin A. Denault, and Michael Cantore, and entitled HIGH-POWER, LASER-DRIVEN, WHITE LIGHT SOURCE USING ONE OR MORE PHOSPHORS,"; and U.S. Provisional Application Ser. No. 61/723,683, filed on Nov. 7, 2012, by Kathryn M. Kelchner and Steven P. DenBaars, entitled "OUTDOOR STREET LIGHT FIXTURE EMPLOYING III-N BASED LASER DIODE PLUS PHOSPHORS AS A LIGHT SOURCE,", all of which applications are incorporated by reference herein.

BACKGROUND OF THE INVENTION

1. Field of the Invention

The present invention relates generally to a white light source employing a III-nitride based laser diode pumping a phosphor.

2. Description of the Related Art (Note: This application references a number of different publications as indicated throughout the specification by one or more reference numbers within brackets, e.g., [x]. A list of these different publications ordered according to these reference numbers can be found below in the section entitled "References." Each of these publications is incorporated by reference herein.)

Prior solid-state white lighting devices typically use a light emitting diode (LED) combined with one or more phosphors to convert a portion of the LED spectrum to other wavelengths in the visible region, the combination of which appears as white light. These devices already offer many advantages over traditional incandescent and fluorescent light sources, including long lifetimes, environmentally friendly designs without the need for mercury, and enormous energy savings.

Yet, the overall efficiency of LEDs remains low. For example, LEDs suffer from efficiency loss and color instability with increased operating current. Moreover, when operating an LED, the temperature will inevitably increase, resulting in a loss in efficiency for the phosphor particles as the temperature of the device increases.

In contrast to LEDs, laser diodes (LDs) do not exhibit this efficiency loss, many exhibit increased efficiency as current increases, and maintain color stability. Thus, there is a need in the art for improved solid-state white lighting devices that rely on LDs. The present invention satisfies this need.

SUMMARY OF THE INVENTION

To overcome the limitations in the prior art described above, and to overcome other limitations that will become apparent upon reading and understanding the present specification, the present invention discloses a white light source employing one or more III-nitride based laser diodes pumping one or more phosphors. The III-nitride based laser diode emits light in a first wavelength range that is down-converted to light in a second wavelength range by the phosphor, wherein the light in the first wavelength range is combined with the light in the second wavelength range to create highly directional white light. The light in the first wavelength range comprises ultraviolet, violet, blue and/or green light, while the light in the second wavelength range comprises green, yellow and/or red light.

BRIEF DESCRIPTION OF THE DRAWINGS

Referring now to the drawings in which like reference numbers represent corresponding parts throughout.

DETAILED DESCRIPTION OF THE INVENTION

Figure 1:
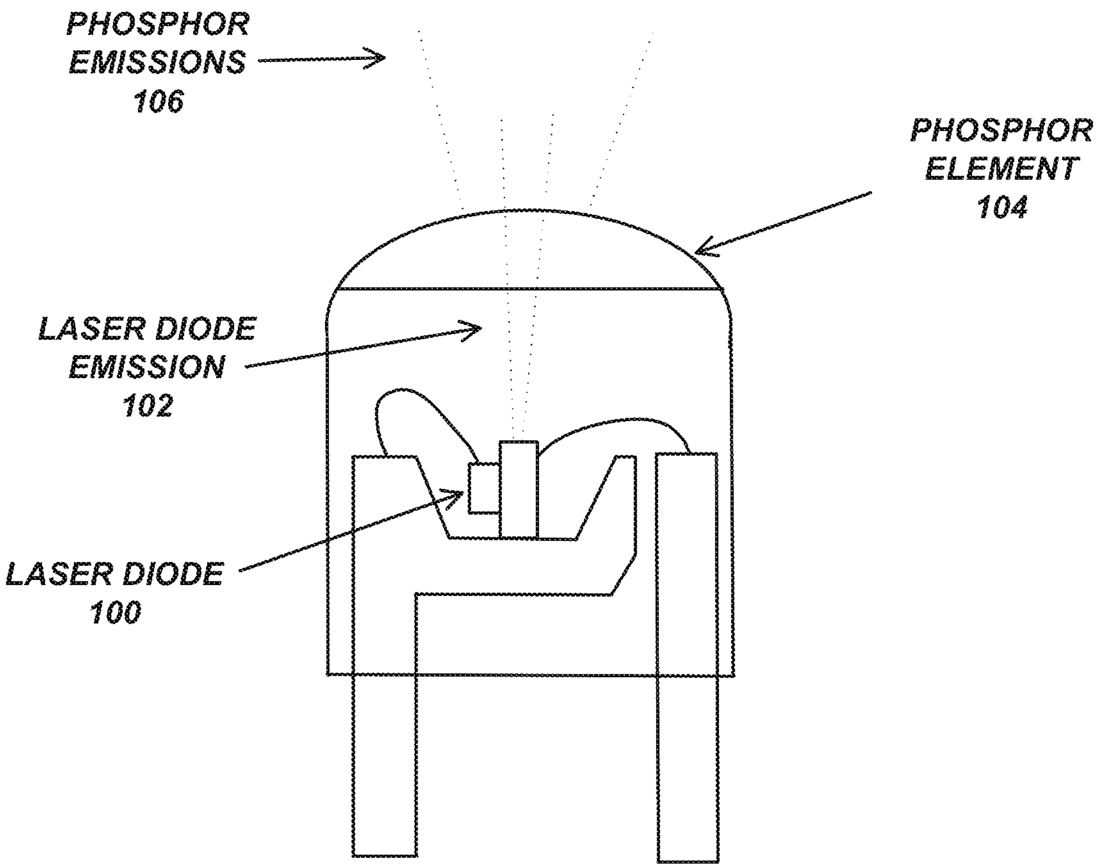
FIG. 1 is a schematic of a single III-nitride based laser diode emitting at a first wavelength optically coupled to a phosphor element emitting a second wavelength, according to one embodiment of the present invention.

In the following description of the preferred embodiment, a specific embodiment in which the invention may be practiced is described. It is to be understood that other embodiments may be utilized and structural changes may be made without departing from the scope of the present invention.

Overview

This invention entails a novel white light source for applications ranging from indoor lighting to a variety of specialized illumination and display applications. The key features and novelty of this invention is the combination of one or more electrically-injected, III-nitride based LDs and one or more remote phosphor elements. When the light from the III-nitride LDs is directed onto the phosphors, the phosphors emit at a longer wavelength than the III-nitride LDs, and the wavelengths combine to create highly directional white light.

Specifically, the LED element of a phosphor-converted white light system is replaced with a III-nitride LD, wherein the light output from the III-nitride LD is coherent, narrow in bandwidth and beam size, and highly directional, as compared to the light output from an LED. The phosphor element may comprise a powder, particles embedded in a polymer material, a polycrystalline plate, or a single crystal phosphor plate, which has the added benefit of maintaining the polarization of the light output from the III-nitride LD. The spectrum of the final "white" light output is a combination of both the III-nitride LD light emission, which may comprise ultraviolet (UV), violet, blue, blue-green, and/or green emissions, with the phosphor emission, as opposed to the III-nitride LD being used to pump the phosphor and the light output consisting solely of phosphor emission. For example, the III-nitride LD light may not be fully absorbed by the phosphor element, such that the III-nitride LD output spectrally contributes with the phosphor element output to the total light output.

Note that, because the LD light is essentially a point source, it may be easily collected and guided using existing optical technologies. In this way, manipulating the LD light is more straightforward compared to LED based technologies which require more extensive light extraction techniques. External optical elements such as high reflectivity mirrors, low loss lenses, low loss fiber optics, beam shapers or collimators may be used in conjunction with the light source to aid in directing the laser light beam onto the phosphor plate or to make necessary modifications to the light beam to increase efficiency or improve the appearance of the light output. Similar elements may be used to direct or modify the output beam beyond the phosphor as well.

This invention may be used as a light source for a variety of lighting applications, particularly those that require directional white light such as headlights, spotlights, floodlights, streetlights, stadium lighting, and theatre lighting. The system can be tailored for the specific application requirements, such as multiple LD arrays, multiple phosphor arrays, or remote phosphors in stand-alone or coupled luminaries.

Technical Description

White light applications using a direct-emission III-nitride laser diode (LD) and a remote phosphor element offer several advantages due to the inherent directionality, small beam size, and spectrally pure light output from the III-nitride LD, in addition to their higher efficiency, speed, and longer lifetimes as compared to traditional bulb-based and LED-based sources.

The output light beam of the electrically injected III-nitride LD, when directed onto the green, yellow, and/or red emitting phosphor, combines to create highly directional white light. The utility of this invention is widespread and may be used as a replacement light source in several illumination markets including general illumination (a.k.a. indoor lighting), outdoor lighting, as well as specialized lighting applications that may require directional light such as spotlights, flashlights, headlamps, theater lighting, stadium lighting, etc. This technology combines the advantages of current state-of-the-art, solid-state lighting (LEDs), with the high efficiency, inherent directionality and ease of light propagation achievable of an LD. This technology may also satisfy requirements of specialized lighting applications that LEDs may not easily fulfill.

Solid state LEDs and LDs are appealing as lighting sources due to their high efficiency, long lifetimes, small size, and mechanical robustness. In recent years, III-nitride LED-based white light sources have begun to replace incandescent bulbs due to their superior lifetime and efficiency, ability to dim, and improved light quality over compact fluorescents. Improving the efficiency of LEDs is an active area of research, and is often reported in terms of wall plug efficiency (WPE), the total optical power out of the device over total electrical input power.

The highest WPE ever reported from a solid-state emitter was a GaAs-based LD with a peak WPE of 76% emitting in the infrared spectrum. [2]. WPE values of III-nitride LDs in the violet, blue and green wavelengths are rapidly improving. Commercially available blue LDs are already as high as 35% and are rapidly improving through the use of improved wave-guiding and use of alternative crystal planes.

Luminous efficacy is also frequently reported in units of lumens per watt (lm/W) and is a measure of the devices output power visible to the human eye at a given input electrical power. Current state-of-the-art white lighting using blue InGaN-based LED plus phosphors has achieved luminous efficacies of nearly 250 lm/W and WPE of nearly 60%. [1]

The correlated color temperature (CCT) of a dual or tri-color light source can represents how well the spectrum mimics that of a blackbody emitter and, in terms of chromaticity values, would lay along the Planckian or blackbody locus of the Commission Internationale de L'Eclairage (CIE) chromaticity coordinates diagram. Typical CCT values of commercial LED-based products range from warm white of 3000K to cool white of 7000K. The color rendering index (CRI) is a quantitative measure of how well a light source illuminates different colors, typical values for light sources vary a lot but most indoor lighting score above 50, with a perfect black body emitter at 100.

Benefits of an LD Versus an LED

Among other advantages, an LD-based white light source may prove to be more energy efficient, easier and cheaper to manufacture than current state of the art LED-based white light, especially those applications that may require directional or polarized light.

In an ideal visible light emitter, all of the photons emitted from the active area would emit into free space as usable (visible) light. However, the light emission from the active region of an LED is approximately isotropic, meaning light emits in all directions equally. For GaN, the light emission from the active region is not entirely isotropic due the wurtzite crystal structure. For InGaN-GaN, the dipole transition parallel to the c-axis is not observed and the emission pattern actually prefers emission along the c-axis. [2]

Light generated in the active region of an LED is subject to several loss mechanisms, such as absorption by the substrate or metal contacts, as well as total internal reflection (TIR) due to the high refractive index of the substrate material. In fact, an estimated 90-95% of the light generated in the active region can be trapped by TIR, significantly reducing extraction efficiency and WPE. [3] Improving the extraction efficiency of an LED can be achieved using a variety of techniques such as external encapsulation, surface roughening, chip shaping, or photonic crystals. LEDs may also employ a flip chip configuration or conductive, transparent contacts to minimize absorption of the substrate or metal contacts, respectively; however, these techniques are difficult to fabricate and may have negative impact on the total WPE. For white light, efficient violet or blue LEDs also require carefully designed encapsulation to promote mixing of light output with phosphors in addition to encouraging light extraction.

Unlike LEDs, light extraction from an LD is very straightforward. A laser light output is limited to a highly focused beam from the laser facet, which is nearly a perfect point source less than a micron in scale. Edge-emitting Fabry-Perot LDs can be fabricated using well-known, straightforward processing techniques. Because the light output of an LD source is coherent, the spectral width is much narrower than LED based sources, less than a nanometer compared to tens of nanometers. The narrow linewidth and high color purity of the LD source is beneficial for display applications, as multiple wavelength LD-based displays have been shown to yield a larger color gamut able to render a wider range of colors compared to bulb or LED-based displays. [4]

The size and shape of the LD output beam may be controlled by adjusting the dimensions of the ridge waveguide, for example. High reflectivity (HR) facet coatings, such as oxide-based distributed Bragg reflectors (DBR) mirrors, can be employed at the LD facets to reduce optical losses and lasing threshold. These HR coatings, easily applied by ion beam deposition, may be used in a conjunction with anti-reflective (AR) coatings to encourage high output power from a single facet.

Another advantage of LDs over LEDs is a singulated LD die (~0.01 $mm^2$) takes up one-tenth of the area of a small area LED (0.1 $mm^2$) and one-hundredth of the area of a large area LED (1.0 $mm^2$). This gives 10 to 100 times more devices per unit area on a single substrate as compared to LEDs. Further, fabrication of LDs can be done using well-known, straightforward fabrication techniques. For example, LDs may employ metal contacts that have superior electrical performance over transparent conductive oxides such as ITO often used in LED fabrication.

Moreover, arrays of multiple LDs may be fabricated very close together. Because the light is emitted at the edge of an LD, they benefit from the use of thick, highly conductive metal contacts with superior electrical performance over transparent conductive oxides such as ITO typically used in to emitting LEDs, which should allow for low contact resistance, reduced operating voltage, and easy fabrication techniques. Depending how the facets are formed, LDs don't require substrate removal which may help with thermal management.

LDs also operate at much higher current densities, on the order of $kA/cm^2$ as compared to LED devices which operate in the order of $A/cm^2$. Such a high current density point source leads to a very concentrated light output that is easy to couple into external optical elements to direct the light towards the phosphor plate without significant optical or scattering loss. Eternal elements already exist for LDs in the visible spectrum and can be easily implemented depending on the requirements of the lighting application. Light output from LDs are inherently polarized, maintaining this property can be an advantage for applications that require polarized light, as avoids the need for an external polarizer that can be a significant source of efficiency loss.

Due to the relatively long radiative lifetimes associated with spontaneous emission, LED modulation rates are in the Mb/s range, and laser sources, which benefit from the shorter radiative lifetimes associated with stimulated emission, can achieve modulation rates in the Gb/s range. [5] The ability to rapidly modulate solid-state devices allows them to sense and transmit information wirelessly at high speeds, enabling their use for communication purposes outside the over-crowded radio frequency band.

Nonpolar and Semipolar III-Nitride LDs

Nonpolar and semipolar crystal orientations of III-nitride materials, such as GaN, may be used as an alternative to widely used basal c-plane GaN by taking advantage of the inherent asymmetry of the GaN wurtzite crystal structure. III-nitride LDs grown on these alternative crystal planes benefit from reduced polarization-related electric field effects which leads to increased radiative efficiency, improved carrier transport, low transparency current density, increased gain, more stable wavelength emission, and simplified waveguide designs. [6,7] The polarization of the lasing mode is aligned along a particular crystallographic direction, which is an important factor for device design to take advantage of the inherent anisotropy. [8,9] Large optical bandwidths of nonpolar and semipolar GaN LDs may lead to reduced speckle, which is beneficial for lighting and projection applications. For blue lasers on non-c-plane LDs, WPE above 20% recently achieved with output powers up to 750 mW in single-mode continuous-wave (CW) operation [10], rivaling standard c-plane crystal orientation in terms of device performance.

Use of Phosphor Elements

Early demonstrations of four-color LD-based light source without phosphors had virtually indistinguishable color rendering compared to high quality state-of-the-art photonic crystal LEDs (PC-LEDs) and incandescent light bulbs. This demonstration, however, used frequency-doubled lasers for blue, green and yellow LDs, which are inherently less efficient and larger form factors than direct emission LDs. [11] Despite the remarkable success and rapid developments of III-nitride LEDs and LDs for lighting and display applications in the visible spectrum, InGaN-based emitters still show reduced efficiencies for longer emission wavelengths beyond green and towards yellow and red spectrums, a phenomenon referred to as the green gap. For this reason, LED-based light sources use external phosphor elements to emit broader, longer wavelength light. Phosphor elements absorb higher energy (shorter wavelength) light from an LED or LD source, then emit light at a lower energy (longer wavelength), a process called phosphor down-conversion.

Phosphors emitting in the green, yellow, or red in conjunction with III-nitride devices emitting in violet or blue, for example, combine to create white light.

Due to the limitations of InGaN and AlInGaP efficiency in the green and yellow parts of the visible spectrum, current high efficiency LED-based white lighting applications employ phosphor down-conversion for broad spectrum white. In these systems, an InGaN LED emits violet or blue light and pumps the phosphor, which fluoresces and emits green, yellow and/or red light. The wavelengths combine to create white.

Phosphor elements for LED applications span a variety of substances, emit at a variety of wavelengths, and exist in a variety of form factors such powders, powders in a polymer binders, polycrystalline solids, and single crystal solids. Different types of phosphors currently used for phosphor-converted LEDs, including Cerium(III)-doped YAG (YAG: $Ce^{3+}$, or $Y3Al_5O_{12}$:$Ce^{3+}$), other garnets, non-garnets, sulfides, and (oxy)nitrides, may also be used with LD sources. YAG is often used in LED-based applications because it absorbs blue light and emits broad spectrum centered in the yellow.

The use of single crystal phosphor plates has several advantages over other phosphor-containing elements, particularly in terms of increased photoelectric yield (30-40% according to Mihóková et al.). [12] In addition, the light output from a single crystal phosphor plate maintains the polarization of the incoming light source, as demonstrated with top-emitting nonpolar/semipolar GaN-based LEDs. Edge-emitting laser waveguides on basal-plane oriented GaN-based or nonpolar/semipolar GaN with waveguides oriented parallel to the c-direction will also emit linearly polarized light. [13]

Coupling the laser light towards the phosphor element may be very simple: allow the light beam to propagate through air and intercept the plate at the desired angle of incidence. Additional optical elements may also be used to guide and shape the laser beam. The placement, angle, thickness and texture of the phosphor must be taken to account to reduce reflections and encourage coupling, light extraction and color mixing, of which anti-reflective coatings or roughening the surface of the plate may help. Applications requiring superior color temperature and color rendering may employ single or multiple LDs and a single or multiple phosphors. Below are described some possible configurations of a novel, laser based white light source, including some results of initial demonstrations.

Possible Configurations

Single LD and Single Phosphor

Figure 2:
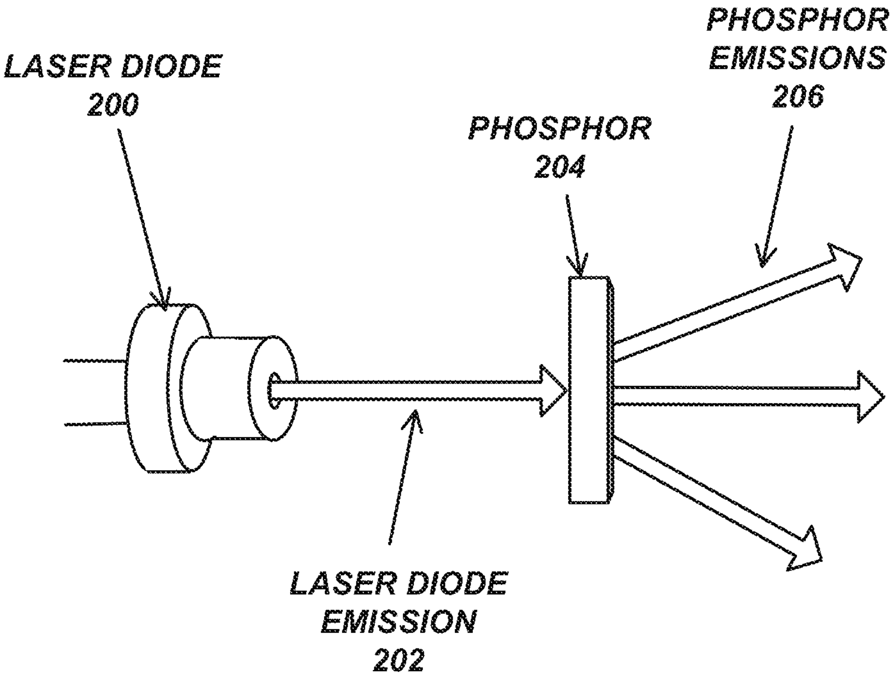
FIG. 2 is a schematic of a single III-nitride laser diode emitting at a first wavelength optically coupled to a phosphor element emitting a second wavelength, according to another embodiment of the present invention.
Figure 3:
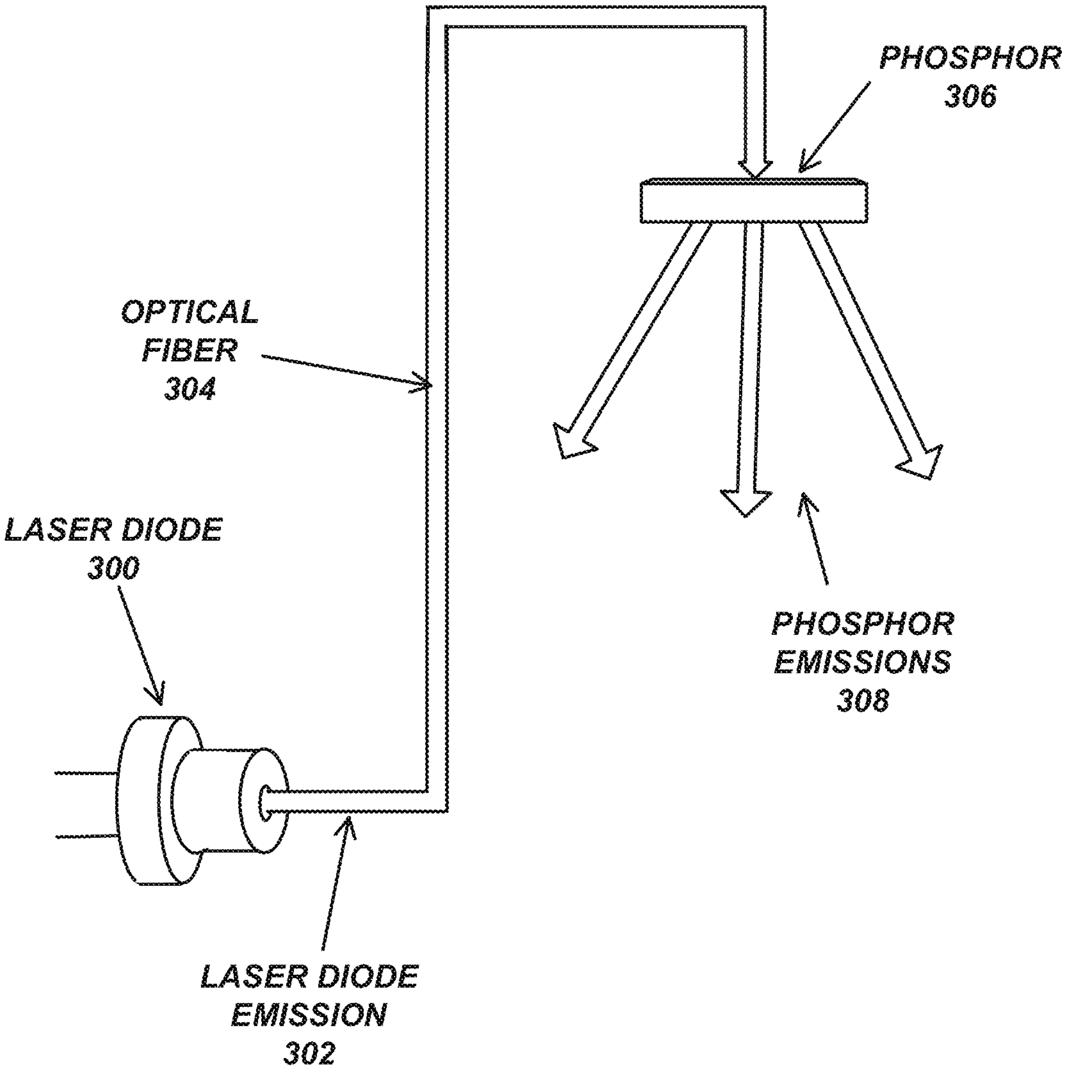
FIG. 3 is a schematic of a single III-nitride laser diode emitting at a first wavelength optically coupled via an optical fiber to a phosphor element emitting a second wavelength, according to yet another embodiment of the present invention.

FIG. 1 is a schematic of a single III-nitride LD 100 emitting at a first wavelength 102 optically coupled to a phosphor element 102 emitting a second wavelength 104 according to one embodiment of the present invention. FIG. 2 is a schematic of a single III-nitride LD 200 emitting at a first wavelength 202 optically coupled to a phosphor element 204 emitting a second wavelength 206 according to another embodiment of the present invention. FIG. 3 is a schematic of a single III-nitride LD 300 emitting at a first wavelength 302 optically coupled via an optical fiber 304 to a phosphor element 306 emitting a second wavelength 308 according to yet another embodiment of the present invention.

Each embodiment of FIGS. 1, 2 and 3 comprises a simple configuration that includes an electrically injected III-nitride-based laser diode shining directly onto a phosphor element oriented perpendicular to the beam. The phosphor may exist as a powder, phosphors embedded in a polymer material, a polycrystalline plate, or a single crystal phosphor plate. The III-nitride LD and phosphor configuration may be realized several ways to achieve efficient white light for general illumination and can be easily adapted for specialized lighting applications to take advantage of the inherent directionality and polarization of the III-nitride LD light source. Distance apart and relative angle, or the use of intermediate optical elements may be necessary depending on specific application requirements such as output power, color rendering index (CRI), correlated color temperature (CCT), as well as the directionality and spot size.

Some examples of this single III-nitride LD and phosphor element combination may include:

- a blue (440-470 nm) light emitting III-nitride LD pumping a single crystal YAG-based phosphor,
- a blue (440-470 nm) light emitting III-nitride LD pumping a YAG-based yellow light emitting phosphor, and
- a blue-green (440-500 nm) light emitting III-nitride LD pumping a red light emitting phosphor.

A number of additional optical elements may help direct and align the laser diode light beam onto the phosphor, such as an objective lens to collimate the laser diode beam output and a beam shaper to reconfigure the Gaussian profile of the laser beam into a collimated flat-top profile for more even distribution of the light onto the phosphor plate. Additional optical elements may include mirrors or fiber optics to direct the laser light from a remote source onto the phosphor plate.

The inventors performed some initial demonstration measurements of an LD based white light source using a single III-nitride blue LD emitting at 442 nm with an inherent WPE of around 35%, and a variety of single crystal phosphor plates including powder YAG:Ce, single crystal YAG:Ce, and single crystal YAG:Ce+red. These demonstration measurements were performed in an integrating sphere while the LD was operated under pulsed 1% duty cycle. The location and angle of the phosphor element was adjusted to achieve chromaticity values along the Planckian locus.

Figure 4:
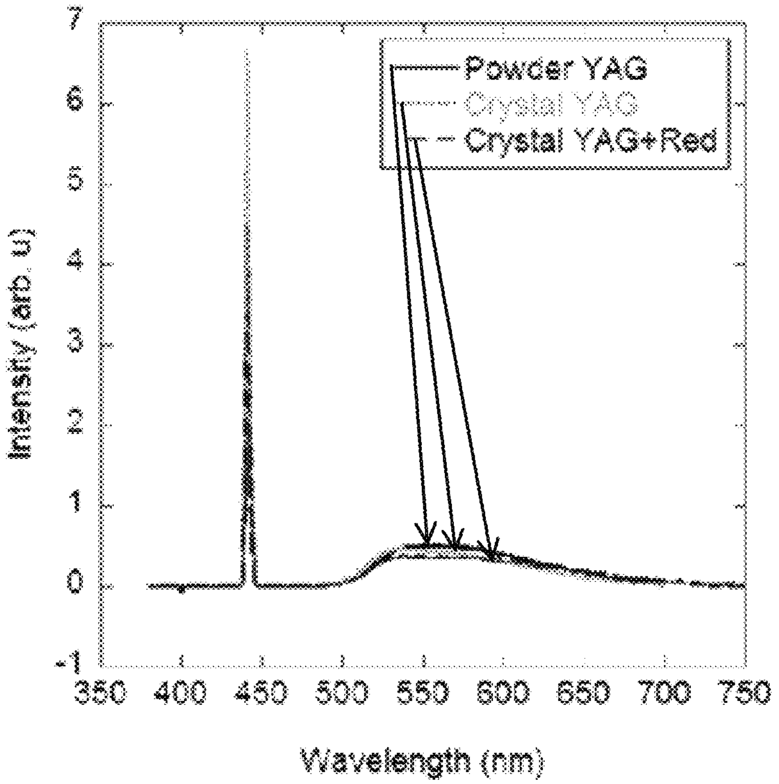
FIG. 4 is a graph of spectral output of a III-nitride laser diode and phosphor combination using powder YAG, crystal YAG and crystal YAG plus red.

The emission spectra for the LD plus each of the three phosphor elements are shown in FIG. 4. FIG. 4 is a graph of spectral output of LD plus phosphor demonstration using powder YAG, crystal YAG and crystal YAG plus red.

Figure 5:
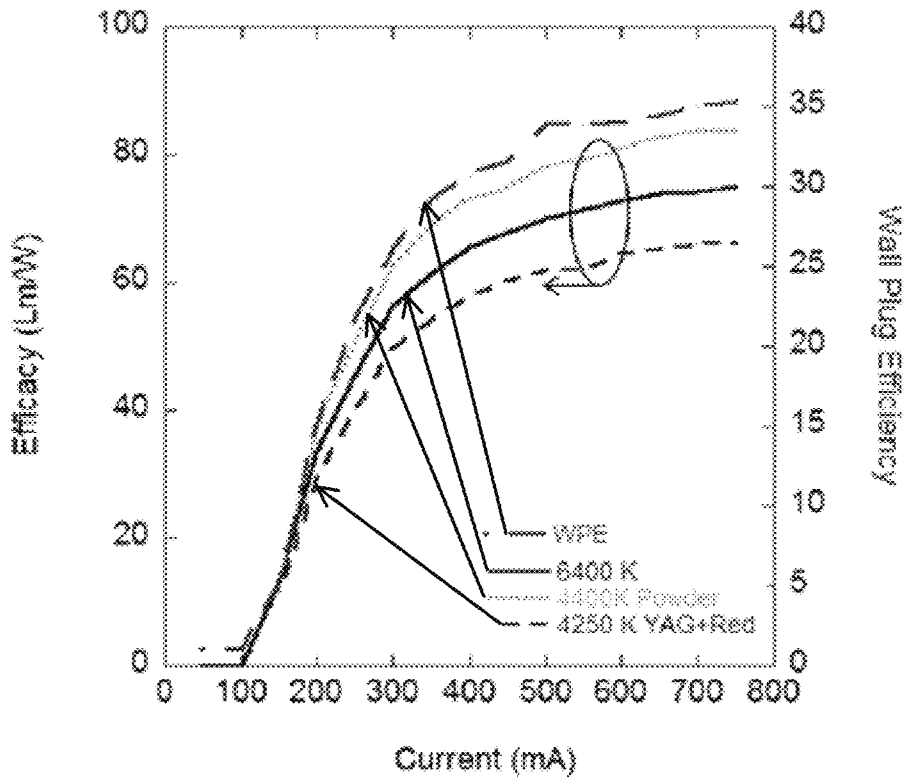
FIG. 5 is a graph of the luminous efficacy values of a III-nitride laser diode combined with phosphors, as well as wall plug efficiency of the laser diode.

The luminous efficacy and WPE are shown in FIG. 5. FIG. 5 is a graph of the luminous efficacy values of LD plus phosphors, as well as WPE of LD source.

The correlated color temperature (CCT) ranged from 4250-6550 K for all three samples, and the color rendering index (CRI) ranged from 57-64 for all three configurations. The luminous efficacy values for the LD plus phosphor, shown in FIG. 5, ranged from 66 to 83 lm/W. With optimized phosphors, improved laser coupling and beam shaping, it is believed that much higher values luminous efficacy could be easily obtained, demonstrating marketability of even a simple configuration of this invention.

Single LD with Multiple Phosphors

For improved color temperature and CRI, it may be useful to employ multiple phosphor elements. For example, a blue LD may pump both yellow and red phosphors, or a violet LD may pump green, yellow and red phosphors.

Figure 6:
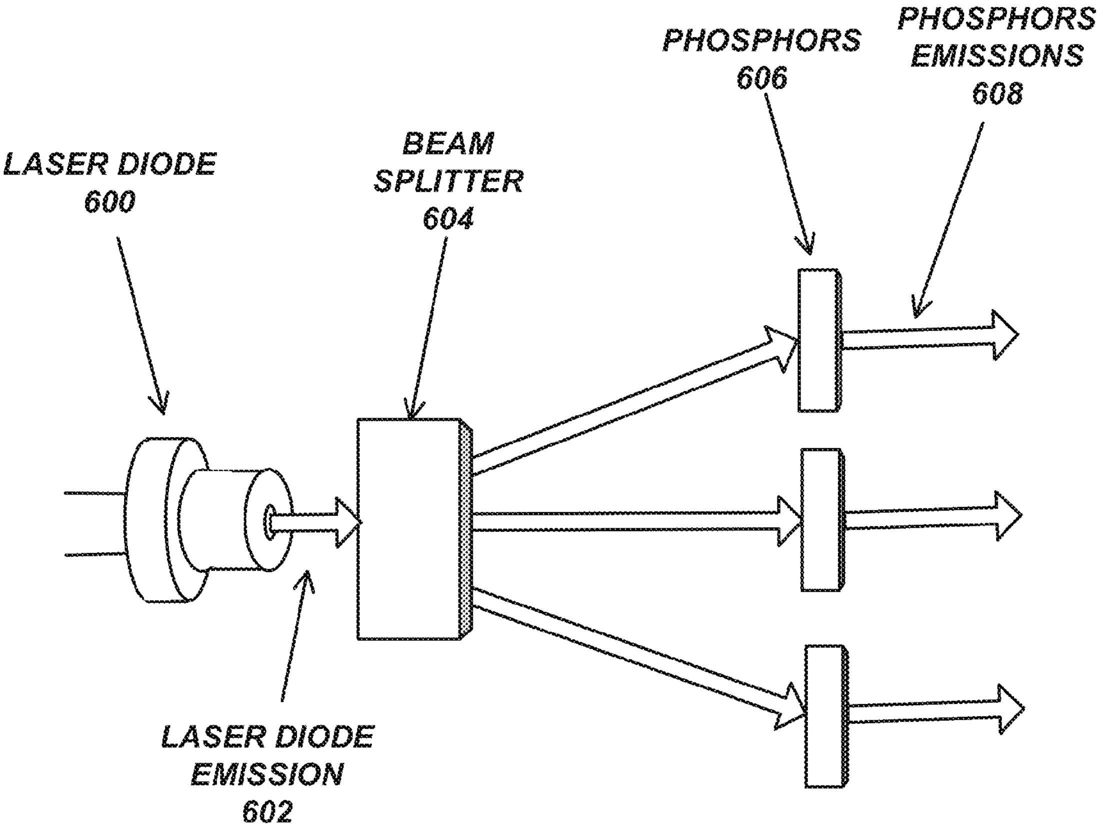
FIG. 6 is a schematic of a single III-nitride laser diode emitting at a first wavelength optically coupled via a beam splitter to multiple phosphor elements emitting at different wavelengths, according to an embodiment of the present invention.

FIG. 6 is a schematic of a single III-nitride LD 600 emitting at a first wavelength 602 optically coupled via a beam splitter 604 to multiple phosphor elements 606 emitting at different wavelengths 608 according to an embodiment of the present invention. Specifically, in this embodiment, the beam-splitter prism 604 is used to separate beam 602 from the single III-nitride LD 600 to excite multiple remote phosphor plates 606.

Examples of this configuration may include:

a violet (390-420 nm) light emitting III-nitride LD pumping blue, green and red light emitting phosphors, a blue (420-470 nm) light emitting III-nitride LD pumping YAG yellow and red light emitting phosphors, and a blue (420-470 nm) light emitting III-nitride LD pumping YAG green, yellow and red light emitting phosphors.

Multiple LDs with Multiple Phosphors

Multiple LD sources of the same or different lasing wavelengths may be used to improve the light output efficiency and avoid thermal losses due to heating of the phosphor and/or reducing or eliminating the Stokes shift losses.

Figure 7:
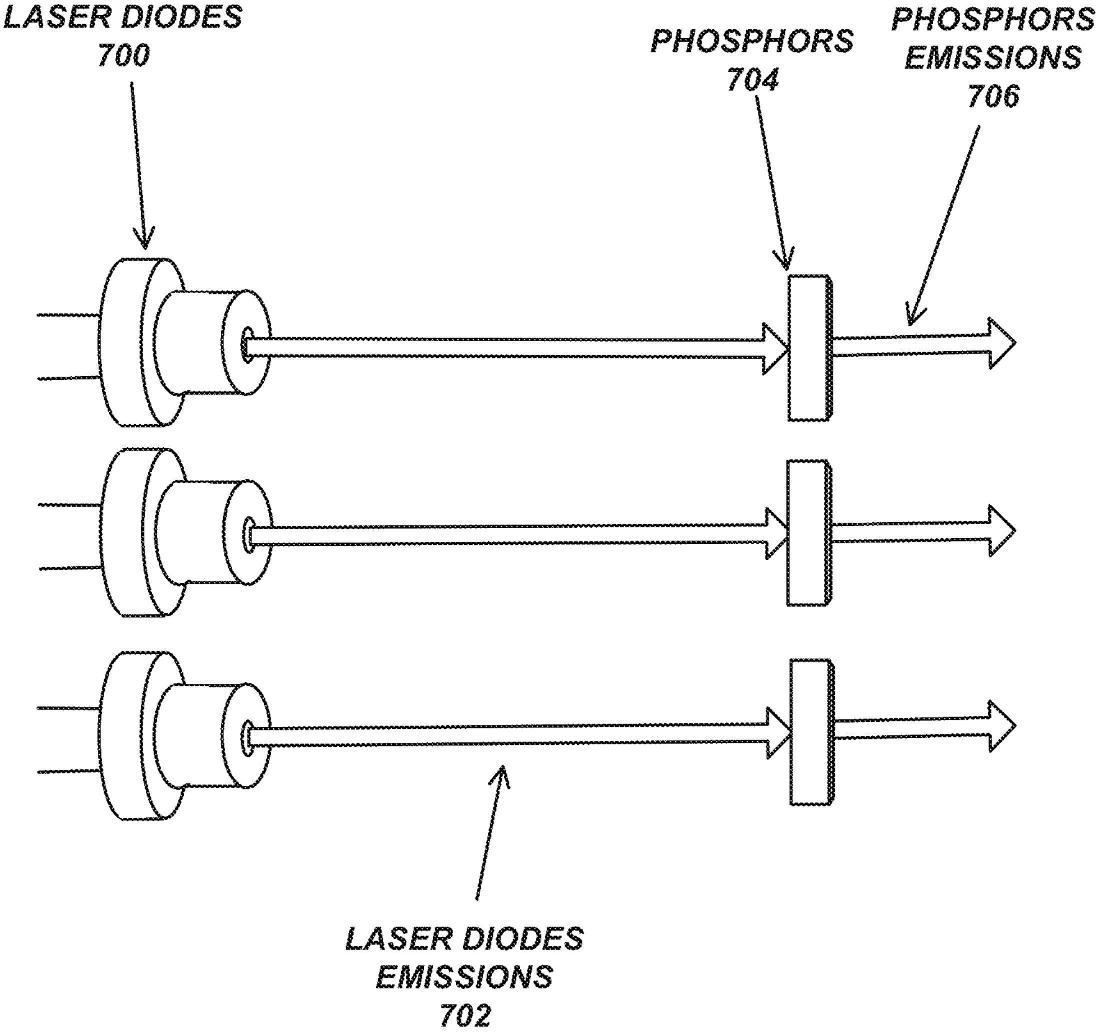
FIG. 7 is a schematic of multiple III-nitride laser diodes emitting at different wavelengths, with each III-nitride laser diode optically coupled to one of multiple phosphor elements emitting at different wavelengths, according to an embodiment of the present invention.

FIG. 7 is a schematic of multiple III-nitride LDs 700 emitting at different wavelengths 702, with each III-nitride LD optically coupled to one of multiple phosphor elements 704 emitting at different wavelengths 706, according to an embodiment of the present invention. Specifically, in this embodiment, the individual output 702 from each III-nitride LD 700 is directed toward a different phosphor element 704 depending on wavelengths 702 of the III-nitride LDs 700 and phosphors 704, and the desired color output.

Examples may include:

multiple violet (390-420 nm) light emitting III-nitride LDs pumping YAG blue and green light emitting phosphors, and a blue (420-470 nm) light emitting III-nitride LD pumping red light emitting phosphors.

Multiple LDs with Single Phosphors

For maximum color rendering and CRI values, as well as large range and tenability, multiple LDs of either the same or different wavelength may be incorporated in a system using a single phosphor.

Figure 8:
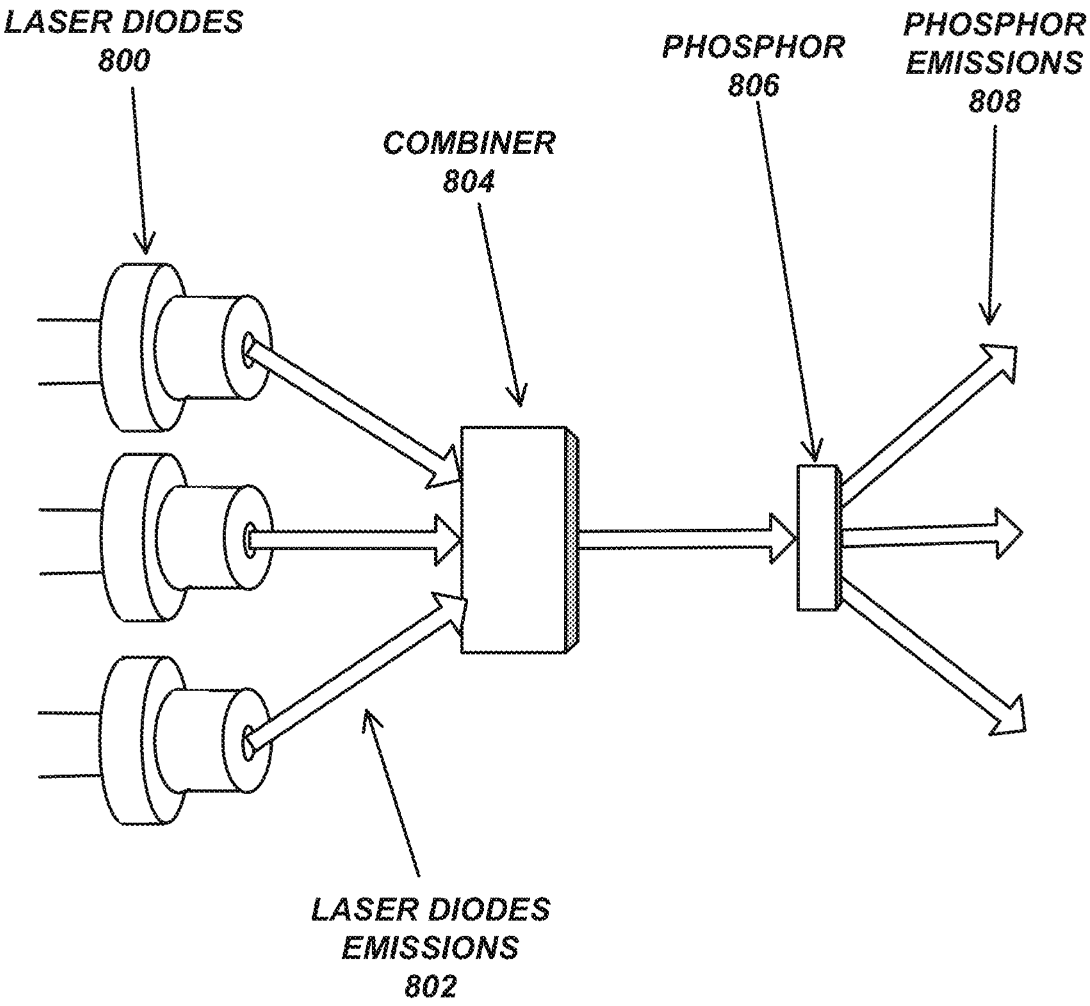
FIG. 8 is a schematic of multiple III-nitride laser diodes emitting at the same or different wavelengths optically coupled via a combiner to a single phosphor element emitting at a different wavelength, according to an embodiment of the present invention.

FIG. 8 is a schematic of multiple III-nitride LDs 800 emitting at the same or different wavelengths 802 optically coupled via a combiner 804 to a single phosphor element 806 emitting at a different wavelength 808, according to an embodiment of the present invention.

Examples may include:

one or more blue (420-470 nm) light emitting III-nitride LDs and one or more green (500-530 nm) light emitting III-nitride LDs pumping a red light emitting phosphor.

Other Considerations

Laser light may be easily collected and guided using beam shapers or collimators to couple into fiber optics, which may introduce some loss. Other external optical elements, such as mirrors, may be used in conjunction to aid in directing the laser light beam onto the phosphor plate or to make necessary modifications to the light beam to increase efficiency or improve the appearance of the light output. Similar elements may be used to direct or modify the output beam beyond the phosphor as well, as for more diffused or more focused light. Adjustable apertures may be used to adjust the output beam size and direction. As opposed to direct, constant emission onto the single crystal phosphor, the laser beam may be pulsed, quickly scanned or rastered across the phosphor plate, with the use of an electro-mechanical elements, such as a MEMS (microelectromechanical systems) device.

Because of the high current density and small size of the LDs, the devices must have adequate heat sinking to avoid premature aging or reducing the lifetime of the device. Mechanical elements with high thermal conductivity may be used to prevent over-heating of the individual elements, particularly the laser diode itself but also the phosphor element. There should also be sound mechanical integrity of the system to avoid misalignment of the laser beam and the optical elements due to external disturbances.

Laser safety may be of concern because visible laser light is high power and focused, which may cause retinal eye damage. White light output from the phosphor should be diffused enough not to pose eye safety hazard, however additional safety precautions should be added to the system to avoid accidental exposure. For example, the power from the laser may be removed if the system is damaged, to avoid stray laser light escaping.

REFERENCES

The following references are incorporated by reference herein:

1. Narukawa, Y., M. Ichikawa, D. Sanga, M. Sano and T. Mukai, "White Light Emitting Diodes With Super-High Luminous Efficacy" Journal of Physics D: Applied Physics. 43 354002 (2010).

2. Crump, P. A., M. Grimshaw, J. Wang, W. Dong, S. Zhang, S. Das, J. Farmer, M. DeVito, L. S. Meng, and J. K. Brasseur, "85% Power Conversion Efficiency 975-nm Broad Area Diode Lasers at −50° C., 76% at 10° C." in Proceedings of the Conference on Lasers and Electro-Optics (CLEO), Long Beach, 2006. Optical Society of America.

3. Pimputkar, S., J. S. Speck, S. P. DenBaars, and S. Nakamura, "Prospects for LED Lighting." Nature Photonics, Vol. 3, April 2009.

4. Someya, J., Y. Inoue, H. Yoshii, M. Kuwata, S. Kagawa, T. Sasagawa, A. Michimori, H. Kaneko, H. Sugiura, SID Symposium Digest of Technical Papers 37 (1): 1134-1137 (2006).

5, Waltereit, P., O. Brandt, A. Trampert, H. T. Grahn, J. Menniger, M. Ramsteiner, M. Reiche & K. H. Ploog. "Nitride semiconductors free of electrostatic fields for efficient white light-emitting diodes." 406, 865-868 (2000).

6. Melo T., Y. L. Hu, Y-L. Hu, C. Weisbuch, M. C. Schmidt, A. David, B. Ellis, C. Poblenz, Y-D. Lin, M. R. Krames and J. W. Raring. "Gain comparison in polar and nonpolar/semipolar gallium-nitride-based laser diodes." Semiconductor Science and Technology 27 (2): 024015 (2012).

7. Scheibenzuber, W., Schwarz, U., Veprek, R., Witzigmann, B. & Hangleiter, A. "Calculation of optical eigenmodes and gain in semipolar and nonpolar InGaN/GaN laser diodes." Physical Review B 80, 1-16 (2009).

8. S. H. Park. "Crystal Orientation Effects on Many-Body Optical Gain of Wurtzite InGaN/GaN Quantum Well Lasers." Jpn. J. Appl. Phys. 42 (2003) L170.

9. K. Okamoto, H. Ohta, S. Chichibu, J. Ichihara, and H. Takasu. "Continuous-Wave Operation of m-Plane InGaN Multiple Quantum Well Laser Diodes." Jpn. J. Appl. Phys. 46 L187 (2007).

10. Raring, J. W., M. C. Schmidt, C Poblenz, Y-C Chang, M. J. Mondry, B. Li, J. Iveland, B. Walters, M. R. Krames, R. Craig, P. Rudy, J. S. Speck, S. P. DenBaars, and S. Nakamura, "High-Efficiency Blue and True-Green-Emitting Laser Diodes Based on Non-c-Plane Oriented GaN Substrates" Applied Physics Express 3 112101 (2010).

11. A. Neumann, J. Wierer, W. Davis, Y. Ohno, S. Brueck, and J. Tsao, "Four-color laser white illuminant demonstrating high color-rendering quality," Opt. Express 19, A982-A990 (2011).

12. Mihóková, E., M. Nikla, J. A. Mares, A. Beitlerova, A. Veddab, K. Nejezchlebc, K. Blazekc, C. D'Ambrosio "Luminescence and scintillation properties of YAG:Ce single crystal and optical ceramics." Journal of Luminescence 126(1): 77-80 (2007).

13. Rass, J., Wernicke, T., Scheibenzuber, W. G., Schwarz, U. T., Kupec, J., Witzigmann, B., Vogt, P., Einfeldt, S., Weyers, M. and Kneissl, M., "Polarization of eigenmodes in laser diode waveguides on semipolar and nonpolar GaN." Phys. Status Solidi RRL, 4: 1-3. (2010)

14. Boeriu, Horatio, "BMW develops laser light for the car," Sep. 1, 2011, http://www.bmwblog.com/2011/09/01/bmw-develops-laser-light-for-the-car/.

15. U.S. Patent Application Publication No: 2010/0032695 A1, published Feb. 11, 2010, by N. Fellows-DeMille, H. Masui, S. DenBaars, and S. Nakamura, entitled "Tunable White Light Based on Polarization Sensitive Light-Emitting Diodes,".

16. Ryu, H. & Kim, D., "High-Brightness Phosphor-Conversion White Light Source Using InGaN Blue Laser Diode," Journal of the Optical Society of Korea 14, 415-419 (2010).

17. Farrell, R. M. , D. A. Haeger, P. S. Hsu, M. C. Schmidt, K. Fujito, D. F. Feezell, S. P. DenBaars, J. S. Speck, and S. Nakamura, "High-power blue-violet AlGaN-cladding-free m-plane InGaN/GaN laser diodes," Appl. Phys. Lett. 99, 171113 (2011).

18. Nichia Corporation, "Products: Laser Diode," 2010, 24 Oct. 2012, http://www.nichia.co.jp/en/product/laser.html.

19. European Patent Publication No. EP1051759A1, published on Nov. 15, 2000, by Srivastava et al., entitled "Light emitting device with phosphor composition."

20. European Patent Publication No. EP1911826A1, published on Apr. 16, 2008, by Murazaki et al., entitled "Phosphor and light-emitting device."

21. P.C.T. International Patent Application Serial No. US2013/05753, filed on Aug. 30, 2013, by Ram Seshadri, Steven P. DenBaars, Kristin A. Denault, and Michael Cantore, and entitled HIGH-POWER, LASER-DRIVEN, WHITE LIGHT SOURCE USING ONE OR MORE PHOSPHORS,", which application claims priority under 35 U.S.C. §119(e) to co-pending and commonly-assigned U.S. Provisional Patent Application Ser. No. 61/695,120, filed on Aug. 30, 2012, by Ram Seshadri, Steven P. DenBaars, Kristin A. Denault, and Michael Cantore, and entitled HIGH-POWER, LASER-DRIVEN, WHITE LIGHT SOURCE USING ONE OR MORE PHOSPHORS,".

Nomenclature

The terms "III-N" or "Group-III nitride" or "III-nitride" or "nitride" as used interchangeably herein refer to any composition or material related to (B, Al, Ga, In)N semiconductors having the formula $B_wAl_xGa_yIn_zN$ where $0 \le w \le 1$, $0 \le x \le 1$, $0 \le y \le 1$, $0 \le z \le 1$, and $w+x+y+z=1$. These terms as used herein are intended to be broadly construed to include respective nitrides of the single species, B, Al, Ga, and In, as well as binary, ternary and quaternary compositions of such Group III metal species. Accordingly, these terms include, but are not limited to, the compounds of AlN, GaN, InN, AlGaN, AlInN, InGaN, and AlGaInN. When two or more of the (B, Al, Ga, In)N component species are present, all possible compositions, including stoichiometric proportions as well as off-stoichiometric proportions (with respect to the relative mole fractions present of each of the (B, Al, Ga, In)N component species that are present in the composition), can be employed within the broad scope of this invention. Further, compositions and materials within the scope of the invention may further include quantities of dopants and/or other impurity materials and/or other inclusional materials.

This invention also covers the selection of particular crystal orientations, directions, terminations and polarities of Group-III nitrides. When identifying crystal orientations, directions, terminations and polarities using Miller indices, the use of braces, { }, denotes a set of symmetry-equivalent planes, which are represented by the use of parentheses, ( ). The use of brackets, [ ], denotes a direction, while the use of brackets, < >, denotes a set of symmetry-equivalent directions.

Many Group-III nitride devices are grown along a polar orientation, namely a c-plane {0001} of the crystal, although this results in an undesirable quantum-confined Stark effect (QCSE), due to the existence of strong piezoelectric and spontaneous polarizations. One approach to decreasing polarization effects in Group-III nitride devices is to grow the devices along nonpolar or semipolar orientations of the crystal.

The term "nonpolar" includes the {11-20} planes, known collectively as a-planes, and the {10-10} planes, known collectively as m-planes. Such planes contain equal numbers of Group-III and Nitrogen atoms per plane and are charge-neutral. Subsequent nonpolar layers are equivalent to one another, so the bulk crystal will not be polarized along the growth direction.

The term "semipolar" can be used to refer to any plane that cannot be classified as c-plane, a-plane, or m-plane. In crystallographic terms, a semipolar plane would be any plane that has at least two nonzero h, i, or k Miller indices and a nonzero 1 Miller index. Subsequent semipolar layers are equivalent to one another, so the crystal will have reduced polarization along the growth direction.

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A light emitting apparatus, comprising:

at least one electrically-injected III-nitride based laser diode optically coupled via an optical fiber to at least one phosphor element located remotely from the laser diode, wherein:

the laser diode emits ultraviolet (UV), violet, blue, blue-green or green light, and has a wall plug efficiency (WPE) of at least around 35%, the light emitted from the laser diode is a focused and directional beam of coherent light output from a facet at an edge of the laser diode, the light emitted from the laser diode is collected and guided onto the phosphor element to optically pump the phosphor element, the phosphor element is a single crystal phosphor plate comprised of powder YAG:Ce, single crystal YAG:Ce, or single crystal YAG:Ce plus red phosphor that maintains a polarization of the light emitted from the laser diode, the light emitted from the laser diode intercepts the single crystal phosphor plate at an angle of incidence that reduces reflections and encourages coupling, light emitted from the phosphor element when optically pumped has a longer wavelength than the light emitted from the laser diode, the light emitted from the laser diode is not fully absorbed by the phosphor element, the light emitted from the phosphor element is combined with the light emitted from the laser diode to create directional white light, and the directional white light is used as a light source in a lighting application that requires directional light.

2. The apparatus of claim 1, wherein the light emitted from the phosphor element comprises green, yellow or red light.

3. The apparatus of claim 1, wherein the phosphor element is oriented perpendicular to the light emitted from the laser diode.

4. The apparatus of claim 1, wherein the at least one laser diode comprises a single laser diode, and the at least one phosphor element comprises a single phosphor element.

5. The apparatus of claim 4, wherein the single laser diode emits blue light in a wavelength range of about 440-470 nm, and the single phosphor element is a single crystal YAG-based phosphor.

6. The apparatus of claim 4, wherein the single laser diode emits blue light in a wavelength range of about 440-470 nm, and the single phosphor element is a YAG-based phosphor that emits yellow light.

7. The apparatus of claim 4, wherein the single laser diode emits blue-green light in a wavelength range of about 440-500 nm, and the single phosphor element is a phosphor that emits red light.

8. The apparatus of claim 1, wherein the at least one laser diode comprises a single laser diode, and the at least one phosphor element comprises multiple phosphor elements emitting light at different wavelengths.

9. The apparatus of claim 8, wherein the single laser diode emits violet light in a wavelength range of about 390-420 nm, and the multiple phosphor elements are phosphors that emit blue, green and red light.

10. The apparatus of claim 8, wherein the single laser diode emits blue light in a wavelength range of about 420-470 nm, and the multiple phosphor elements are YAG-based phosphors that emit yellow and red light.

11. The apparatus of claim 8, wherein the single laser diode emits blue light in a wavelength range of about 420-470 nm, and the multiple phosphor elements are YAG-based phosphors that emit green, yellow and red light.

12. The apparatus of claim 1, wherein the at least one laser diode comprises multiple laser diodes emitting light at different wavelengths, the at least one phosphor element comprises multiple phosphor elements emitting light at different wavelengths, and the light emitted from each of the multiple laser diodes is directed towards a different one of the multiple phosphor elements depending on the wavelengths of the light emitted from the multiple laser diodes, and a desired color output.

13. The apparatus of claim 12, wherein the multiple laser diodes emit violet light in a wavelength range of about 390-420 nm pumping the multiple phosphor elements that are YAG-based phosphors that emit blue and green light, and the multiple laser diodes emit blue light in a wavelength range of about 420-470 nm pumping the multiple phosphor elements that are phosphors that emit red light.

14. The apparatus of claim 1, wherein the at least one laser diode comprises multiple laser diodes emitting light at the same or different wavelengths, and the at least one phosphor element comprises a single phosphor element emitting light at a different wavelength.

15. The apparatus of claim 14, wherein the multiple laser diodes emit blue light in a wavelength range of about 420-470 nm and green light in a wavelength range of about 500-530 nm, and the single phosphor element is a phosphor that emits red light.

16. The apparatus of claim 1, wherein the white light is highly directional as compared to white light created by a light emitting diode.

17. A method of fabricating a light emitting apparatus, comprising:

optically coupling at least one electrically-injected III-nitride based laser diode to at least one phosphor element located remotely from the laser diode via an optical fiber, wherein:

the laser diode emits ultraviolet (UV), violet, blue, blue-green or green light, and has a wall plug efficiency (WPE) of at least around 35%, the light emitted from the laser diode is a focused and directional beam of coherent light output from a facet at an edge of the laser diode, the light emitted from the laser diode is collected and guided onto the phosphor element to optically pump the phosphor element, the phosphor element is a single crystal phosphor plate comprised of powder YAG:Ce, single crystal YAG:Ce, or single crystal YAG:Ce plus red phosphor that maintains a polarization of the light emitted from the laser diode, the light emitted from the laser diode intercepts the single crystal phosphor plate at a an angle of incidence that reduces reflections and encourages coupling, light emitted from the phosphor element when optically pumped has a longer wavelength than the light emitted from the laser diode, the light emitted from the laser diode is not fully absorbed by the phosphor element, the light emitted from the phosphor element is combined with the light emitted from the laser diode to create directional white light, and the directional white light is used as a light source in a lighting application that requires directional light.

18. A white light source, comprising:

a III-nitride laser diode emitting light in a first wavelength range comprising ultraviolet (UV), violet, blue, blue-green or green light that is converted to light in a second wavelength range comprising green, yellow or red light by one or more phosphors located remotely from the laser diode and optically coupled to the laser diode via an optical fiber, wherein:

the laser diode has a wall plug efficiency (WPE) of at least around 35%, the light emitted from the laser diode is a focused and directional beam of coherent light output from a facet at an edge of the laser diode, the light emitted from the laser diode is collected and guided onto the phosphors to optically pump the phosphor element, at least one of the phosphors is a single crystal phosphor plate comprised of powder YAG:Ce, single crystal YAG:Ce, or single crystal YAG:Ce plus red phosphor that maintains a polarization of the light emitted from the laser diode, the light emitted from the laser diode intercepts the single crystal phosphor plate at an angle of incidence that reduces reflections and encourages coupling, light emitted from the phosphors when optically pumped has a longer wavelength than the light emitted from the laser diode, the light emitted from the laser diode is not fully absorbed by the phosphors, the light emitted from the phosphors is combined with the light emitted from the laser diode to create directional white light, and the directional white light is used as a light source in a lighting application that requires directional light.

19. The white light source of claim 18, wherein the phosphors down-convert part or all of the light in the first wavelength range emitted by the laser diode to light in the second wavelength range emitted by the phosphors that is at longer wavelengths.

20. The white light source of claim 18, wherein the light in the first wavelength range is combined with the light in the second wavelength range to create highly directional white light.

21. The white light source of claim 18, wherein each of the phosphors comprise a single-crystal phosphor plate, which maintains a polarization of the light emitted from the III-nitride laser diode.

22. The white light source of claim 18, wherein the light in the first wavelength range is not fully absorbed by the phosphors, such that the light in the first wavelength range is combined with the light in the second wavelength range to create the white light.

* * * * *